(12) United States Patent
Parrish et al.

(10) Patent No.: US 6,515,499 B1
(45) Date of Patent: Feb. 4, 2003

(54) MODULAR SEMICONDUCTOR TESTER INTERFACE ASSEMBLY FOR HIGH PERFORMANCE COAXIAL CONNECTIONS

(75) Inventors: Frank Parrish, Simi Valley; Arash Behziz, El Dorado Hills; Arthur E. LeColst, Moorpark; Derek Castellano, Simi Valley; Donald Eric Thompson, Oak Park; Jonathan M. Becker, Thousand Oaks, all of CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/676,041

(22) Filed: Sep. 28, 2000

(51) Int. Cl.$^7$ ............................................... G01R 31/02
(52) U.S. Cl. ..................... 324/761; 324/158.1
(58) Field of Search ............................. 324/754, 761, 324/158.1, 762; 439/482, 378, 66, 86–91

(56) References Cited

U.S. PATENT DOCUMENTS

| | | | | |
|---|---|---|---|---|
| 5,092,774 A | * | 3/1992 | Millan | 439/378 |
| 5,148,103 A | * | 9/1992 | Pasiecznik, Jr. | 324/754 |
| 5,635,846 A | * | 6/1997 | Beaman et al. | 324/754 |
| 6,198,297 B1 | * | 3/2001 | Riccioni | 324/754 |

FOREIGN PATENT DOCUMENTS

JP          06003371          11/1994

\* cited by examiner

*Primary Examiner*—Vinh P. Nguyen
(74) *Attorney, Agent, or Firm*—Lance Kreisman

(57) ABSTRACT

A tester interface assembly is disclosed for coupling a plurality of tester electronic channels to a device-interface-board. The tester interface assembly includes at least one harness assembly having a plurality of coaxial cables, each cable including a body having a center conductor and a shield. The shield is formed coaxially around the center conductor and separated therefrom by a layer of dielectric. Each cable further includes a distal tip formed substantially similar to the body and including respective formed conductive pads disposed on the distal extremities of the center conductor and the shield. The harness employs a housing formed with an internal cavity for receiving and securing the cable distal ends in close-spaced relationship such that the distal tips form an interface engagement plane. A compliant interconnect is interposed between the harness assembly and the device-interface-board, and includes a plurality of conductors formed to engage the cable distal ends along the engagement plane.

3 Claims, 4 Drawing Sheets

MODULAR SEMICONDUCTOR TESTER INTERFACE ASSEMBLY FOR HIGH PERFORMANCE COAXIAL CONNECTIONS

FIELD OF THE INVENTION

The invention relates generally to automatic test equipment for testing semiconductor devices, and more particularly a tester interface module for electrically coupling a semiconductor tester to a handling device.

BACKGROUND OF THE INVENTION

Automatic test equipment, commmonly referred to as a semiconductor tester, provides a critical role in the manufacture of semiconductor devices. The equipment enables the functional test of each device both at the wafer stage and the packaged-device stage. By verifying device operability and performance on a mass-production scale, device manufacturers are able to command premium prices for quality products.

One convention al type of automatic test system includes a computer-driven test controller and a test head connected electrically to the controller by a heavy-duty multi-cable. A manipulator mechanically carries the test head. The test head generally includes a plurality of channel cards that mount the pin electronics necessary to generate the test signals or patterns to each I/O pin or contact of one or more devices-under-test (DUTs).

One of the primary purposes of the test head is to place the channel card pin electronics as close to the DUT as practicable to minimize the distance that signals must propagate therebetween. The length and construction of the signal path intefaceing the test head to the DUT, commonly referred to as a tester interface, directly affects signals delays and signal losses. Consequently, tester interface schemes that interconnect the pin electronics to the DUT play an important role in the achievable accuracy of a semiconductor tester.

With reference to FIG. 1, one conventional high performance tester interface includes a connector module 12 that houses the terminations for a plurality of coaxial cables 14. The signal conductor (not shown) for each cable couples to a compliant spring-biased contact, more commonly known as a pogo pin 16, while each cable shield couples to the signal pogo barrel. The signal pogo barrel connects, in a side-stepped fashion, to the module 12 as a ground connection. A ground pogo pin assembly 18 connects to the signal pogo barrel to continue the ground path through to a device-interface-board (DIB, not shown). Typically, a plurality of ground paths surround each signal path to minimize high frequency interference.

While the conventional pogo-based tester interface described above works well for its intended applications, one of the drawbacks is a practical bandwidth barrier of around 1 GHz. At such high frequencies, the signal path characteristics emulate transmission lines, generally requiring matched 50-ohm environments. Deviations from the 50-ohms often cause signal degradations that lead to timing inaccuracies and the like. Inaccuracy in the tester may improperly fail devices that perform near threshold levels.

Conventional interface signal path constructions, such as that described above, generally employ numerous connections and discontinuities that affect the characteristic impedance. These constructions often cause reflections at high frequencies that substantially degrade signals at frequencies around 1 GHz. Consequently, for high speed and high accuracy testing of semiconductor devices at and above the 1 GHz range, conventional pogo-pin interface schemes are disfavored.

Conventional pogo pins also present density problems for high channel count testers. For instance, it's generally recognized that to test each pin of a 1024-pin semiconductor device, the tester should have at least 1024 channels (one channel for each pin). Such a high number of signal channels also requires ground and power connections, often resulting in over six-thousand connections for interfacing between the tester and the DUT. With a typical center-to-center spacing of around 0.150 inches, the achievable density or "pitch" of six thousand conventional pogo pins would require an undesirably large DIB. This is unacceptable to many semiconductor device manufacturers that require very efficient "footprints" to maximize available clean-room space. Moreover, this would also require long traces on the DIB to route signals to and from the DUT.

One proposal for a tester interface that avoids the use of conventional pogo pins is disclosed in U.S. Pat. No. 5,944,548 to Saito. The patent discloses a floating coaxial connector scheme that employs an intermediately disposed mount member formed with an oversized opening. The opening receives a spring member and biases a female connector for mating with a male connector. The opening is formed to allow for slight pivoting of the mated coaxial connectors, allegedly minimizing the difficulty in making a standard connection.

While this construction appears beneficial for its intended application, the implementation of relatively large coaxial connectors for each tester channel at the probecard end fails to address the problems noted above regarding channel density and overall tester footprint size.

What is needed and heretofore unavailable is a tester interface that avoids the use of conventional pogo pins and provides high bandwidth signal performance while maximizing tester channel density. These capabilities in turn are believed to minimize the costs attributable to semiconductor device testing. The tester interface module of the present invention satisfies these needs.

SUMMARY OF THE INVENTION

The tester interface module of the present invention provides high accuracy semiconductor device testing for high bandwidth applications while maximizing channel density and substantially improving tester interface reliability. This correspondingly results in lower test costs and higher tester performance.

To realize the foregoing advantages, the invention in one form comprises a tester interface assembly for coupling a plurality of tester electronic channels to a device-interface-board. The tester interface assembly includes at least one harness assembly having a plurality of coaxial cables, each cable including a body having a center conductor and a shield. The shield is formed coaxially around the center conductor and separated therefrom by a layer of dielectric. Each cable further includes a distal tip formed substantially similar to the body and including respective formed conductive pads disposed on the distal extremities of the center conductor and the shield. The harness employs a housing formed with an internal cavity for receiving and securing the cable distal ends in close-spaced relationship such that the distal tips form an interface engagement plane. A compliant interconnect is interposed between the harness assembly and the device-interface-board, and includes a plurality of conductors formed to engage the cable distal ends along the engagement plane.

In another form, the invention comprises a coaxial cable for transmitting high frequency signals. The coaxial cable includes a body having a center conductor and a shield formed coaxially around the center conductor and separated from the center conductor by a layer of dielectric. A distal tip is formed substantially similar to the body wherein the dielectric includes an annular layer of electro-static-discharge polymer.

In yet another form, the invention comprises a method of interfacing a plurality of tester channels to a device-interface-board (DIB). The method includes the steps of routing a plurality of coaxial cables from the tester pin electronics to the DEB and interposing a compliant interconnect between the coaxial cables and the DIB.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
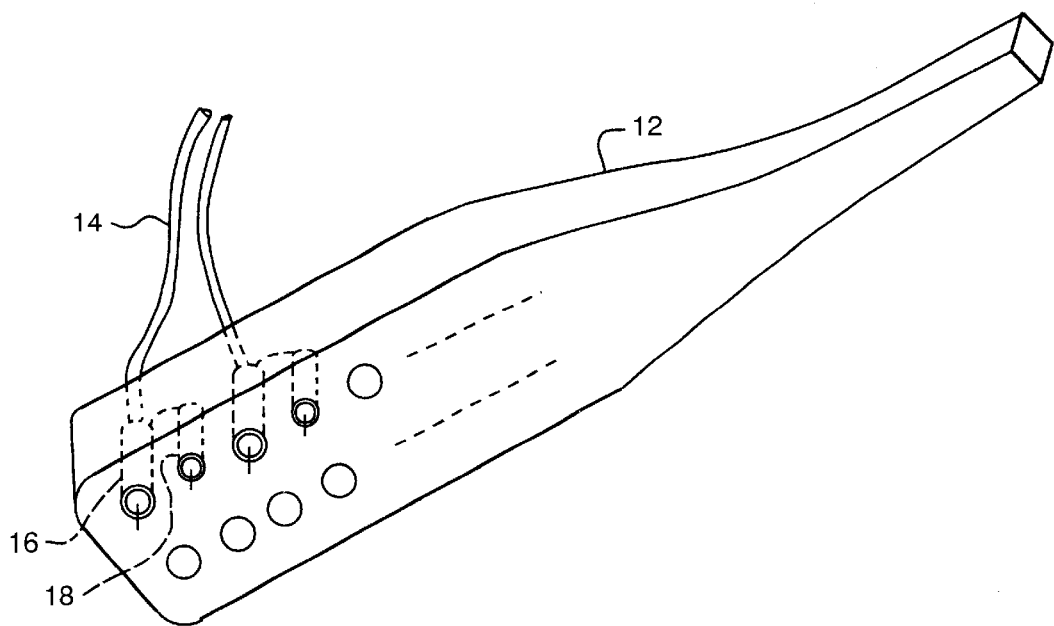
FIG. 1 is a partial perspective view of a conventional interface module.
Figure 2:
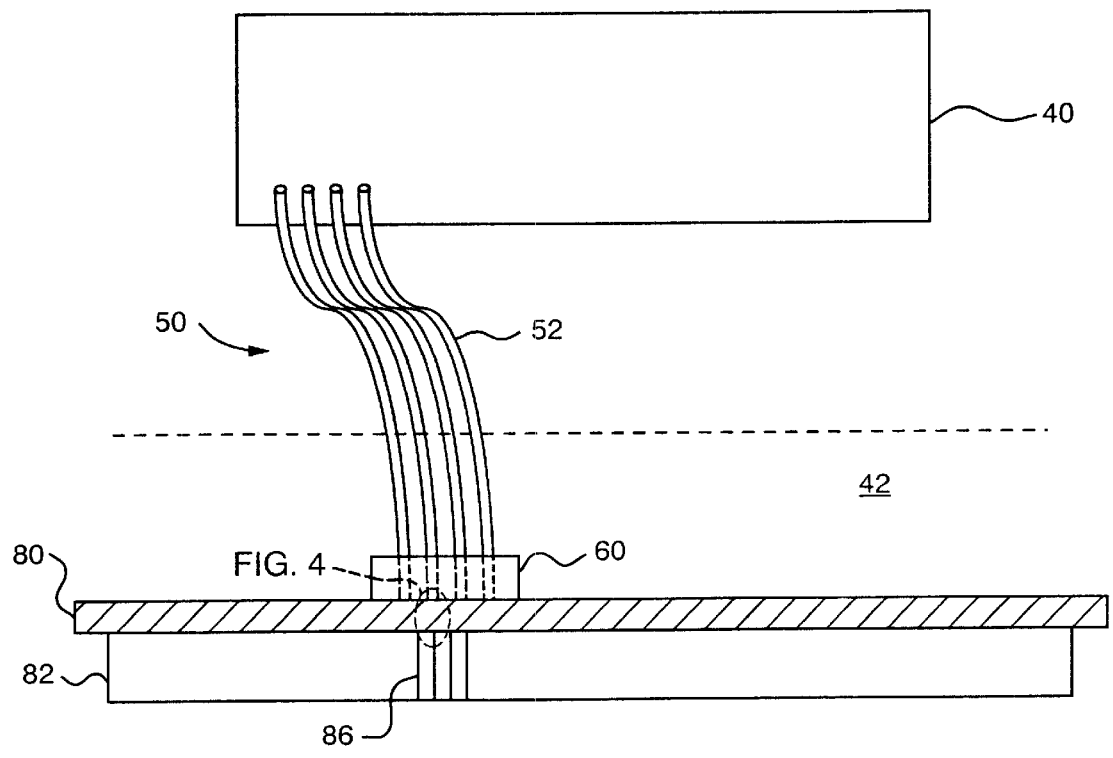
FIG. 2 is a block diagram of a semiconductor testhead coupled to a handling apparatus via the tester interface module of the present invention.

Referring to FIG. 2, the tester interface module of the present invention, generally designated 50, electrically couples a plurality of channels from a channel card in a semiconductor tester testhead to a device-interface-board (DIB) included as part of a handling apparatus (such as a prober or a handler). Because of the unique construction of the module, more fully detailed below, increased accuracy, channel density and signal bandwidth for tester signals is attained without the use of conventional pogo pins.

Figure 3:
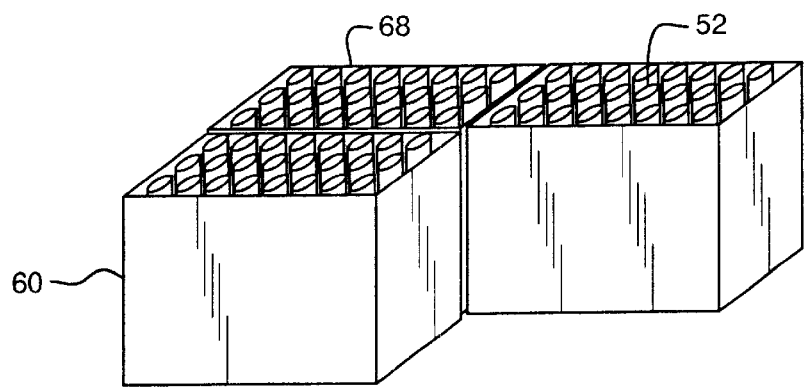
FIG. 3 is a partial perspective view of a plurality of interconnected tester modules.
Figure 4:
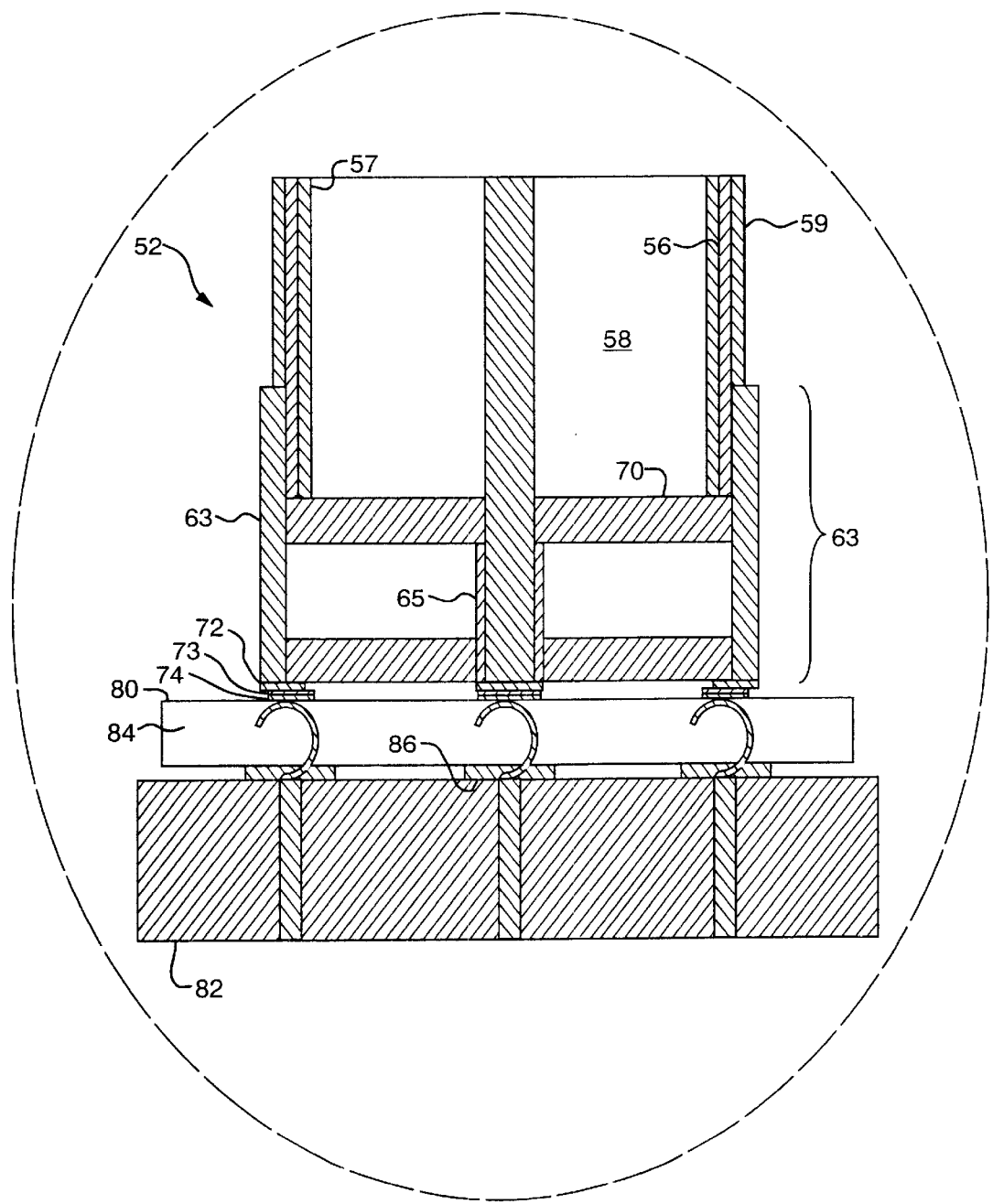
FIG. 4 is a cross-sectional view of the area highlighted by line 4 of FIG. 2.

With reference to FIGS. 2, 3, and 4, the tester interface module 50 according to a first embodiment of the present invention includes a plurality of harnessed coaxial cables 52. The cables are of the type including respective center conductors 54 (FIG. 4) that are concentrically covered by double shields 56 and 57 (FIG. 4) and insulated from the shields by a cylindrical layer of dielectric material 58. For best results, the double shield is formed with a silver-plated copper tape surrounded concentrically by a silver-plated copper wire braid. The cable is jacketed with a thin insulator 59. To maximize conductor density, a cable of the type sold as Multiflex 86 is acceptable, and available from Suhner Multiflex Corp.

The proximal end of each cable 52 terminates in a high density coaxial connector (not shown) that mates to a backplane assembly (not shown) disposed within the testhead. The backplane assembly interfaces to the testhead channel cards.

The distal ends of the bundled group of cables 52 terminate within a metallic housing 60 (FIGS. 2 and 3) in a high-pitch relationship to form a high-density harness structure. The housing comprises an elongated rectangular-shaped block (FIG. 2) formed with an array of spaced-apart bores to form a receptacle for receiving the cable distal ends. As more fully described below, the cable distal ends are installed in the housing such that the cable extremities form an engagement plane.

Referring more particularly now to FIG. 4, each cable distal end includes a formed tip portion 62 (denoted by parenthesis) adapted to engage correspondingly registered contacts formed in a compliant member 80. A ferrule 63 is affixed to the outer periphery of the shield. To compensate for the change in relative diameter between the ferrule and the center conductor 54, a cylindrical contact 65 is soldered around the end of the center conductor to increase its diameter. Because of the close-spaced nature between the center conductor and the ground shield and the relatively large voltage signals transmitted, the tip portion 62 of each coaxial cable includes an annular wafer-shaped layer 70 of electro-static-discharge (ESD) polymer. The polymer electrically disperses high voltage instantaneous bursts between the center conductor 54 and the shield 56. Deposited annularly between the center conductor and the shield, the polymer is available from Littelfuse Inc., Des Plaines, Ill. To provide a reliable electrical contact against the compliant member 80, the distal extremities of the center conductor and the shield are plated with first and second layers of copper 72, nickel 73, and gold 74.

Further referring to FIG. 4, the compliant member 80 comprises an interposer disposed above a probecard 82 and formed of a compressible material interspersed with substantially vertically upstanding and finely spaced-apart conductors 84. One construction is available from Fuji Poly, Inc. An alternative construction is available from Shin-Etsu Corp. in a 0.004×0.004 mm grid (relative spacing between conductors) that includes a plurality of 0.001 mm diameter conductors. Both configurations are suitable to provide sufficient contact with the individual cable contacts 72, 73 and 74, and transmit signals to underlying probecard contacts 86. A clamping apparatus (not shown) maintains the compliant member in compression between the cable tip portions 62 and the probecard surface 82.

Figure 5:
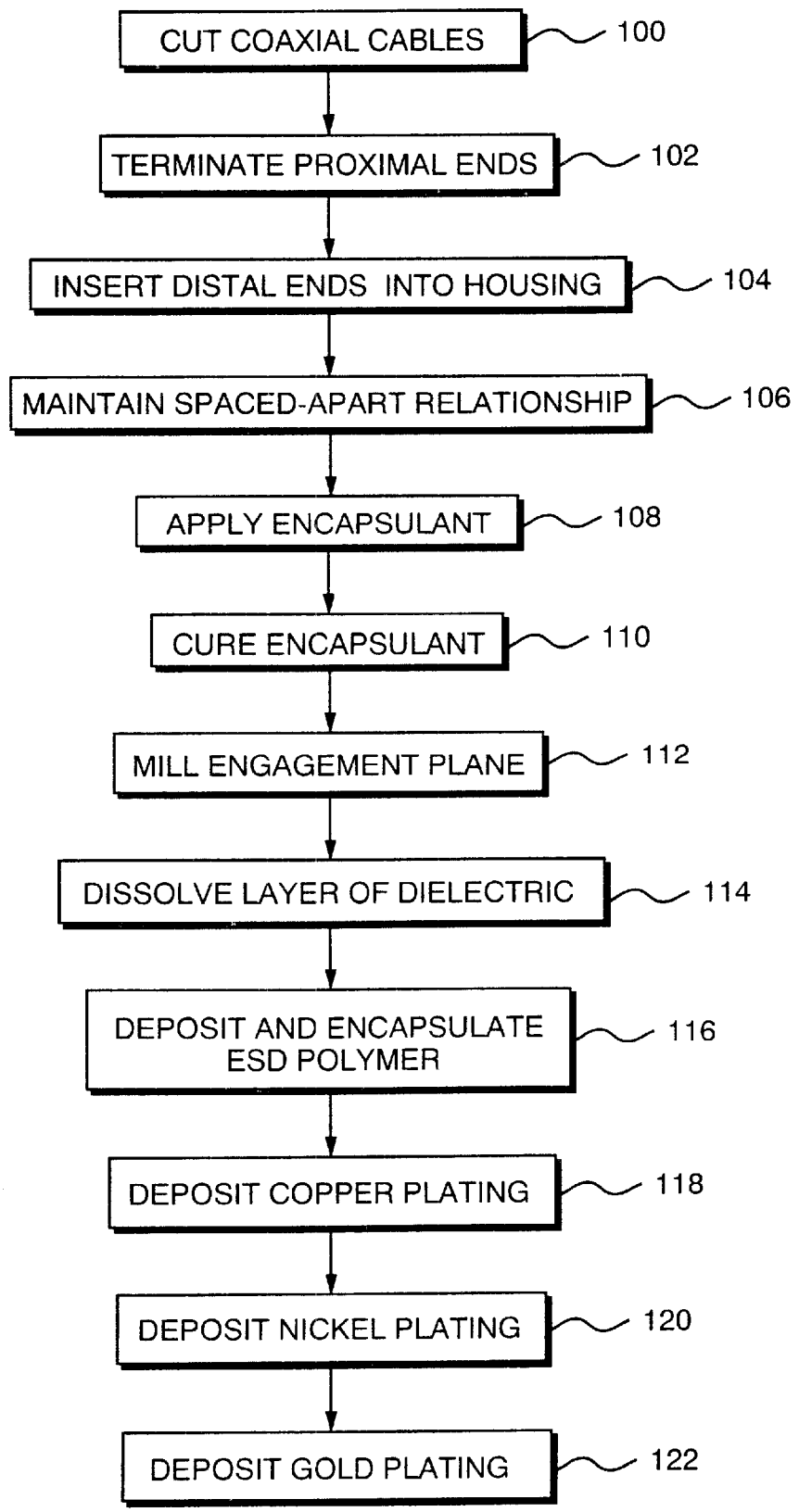
FIG. 5 is a flowchart setting forth steps to fabricate the tester interface module of the present invention.

With reference to FIG. 5, the tester interface module 50 may be fabricated according to one method as a harness assembly, with the cables initially cut, at step 100, and the proximal ends terminated in respective coaxial connectors, at step 102, as is well known in the art. However, the distal ends of the cables are processed as an integral unit according to the following process steps. First, at step 104, the distal ends of the cables are inserted into the respective housing bores, and fixed in precise spaced-apart relationship, at step 106. A suitable encapsulant is applied to the cable group, at step 108, to bond the cables within the housing. After the material has cured, at step 10, the distal extremity of the housing is milled to define an engagement plane, at step 112. The engagement plane is then exposed to an etchant or other suitable substance to dissolve a thin layer of the coaxial cable dielectric, at step 114, and create respective annular cavities. The ESD polymer material is then deposited and encapsulated, at step 116, within the formed annular cavities without covering the center conductors 54 and the shields 56, and let to cure. Following the application of the ESD polymer material, the exposed center conductors and shields are plated, at steps 118, 120 and 122, first with a layer of copper, then a layer of nickel, and finishing with a layer of gold.

The dimensional parameters for each signal path are optimized to provide the closest 50 ohm match as possible to minimize any degradation to propagating signals. The precise sizing necessary to accomplish this will vary with the application desired. Nevertheless, such design parameters are well known to those skilled in the art.

With particular reference to FIG. 2, prior to operation, a plurality of modules are positioned on the compliant member 80 and attached via the connector elements to create a single integral interface unit. Once positioned, the clamping apparatus (not shown) fixes the modules in position, and compresses the compliant member between the modules and the probecard surface. Registration is achieved through direct or indirect alignment of the integral interface unit to the loadboard, prober or handler, using traditional alignment techniques.

In operation, the semiconductor tester channel cards (40) generate and receive high frequency signals for application to and capture from one or more DUTs. Signals for respective channels are transmitted at gigahertz frequencies through the backplane assemblies and along respective interface module signal cables and ground cables adjacent the signal cables. Each tester channel signal is routed along a coaxial cable center conductor and propagates through the finely spaced apart array of compliant member conductors registered thereunder for subsequent connection to the corresponding underlying probecard contact. Because the compliance function is carried out with minimal changes in the relative spacings between the cable center conductor and shield, signal performance and accuracy is maintained at an optimal level.

The inventors have also discovered that by utilizing the tester interface module of the present invention, more vertically direct signal paths are realized because of the high cable density, thereby reducing the need for horizontal stripline paths in the interface. This is important due to the losses introduced into tester signals by stripline traces.

Those skilled in the art will appreciate the many benefits and advantages afforded by the present invention. Of particular importance is the ability to omit conventional pogo pins by implementing a compliant member that substantially maintains the relative coaxial spacings between the center conductor and the shield and forms a robust and highly reliable construction. These features dramatically improve the tester bandwidth and accuracy. Moreover, the modularity of the tester interface module provides a high-density channel integration scheme at the probecard or DIB level for low cost and reduced footprint applications.

While the invention has been particularly shown and described with reference to the preferred embodiments thereof, it will be understood by those skilled in the art that various changes in form and detail may be made therein without departing from the spirit and scope of the invention. For example, while much of the description herein focuses on prober applications, it should be understood that handler applications are intended to be within the scope of the invention.

What is claimed is:

1. A modular tester interface assembly for detachably coupling a plurality of tester electronic channels to a device-interface-board, said tester interface assembly including:

at least one harness assembly including a plurality of coaxial cables, said coaxial cables each including a body having a center conductor and a shield formed coaxially around said center conductor and separated from said center conductor by a layer of dielectric;

a distal tip formed substantially similar to said body and including respective formed conductive pads disposed on the distal extremities of said center conductor and said shield; and a connector housing formed with an internal cavity for receiving and securing said cable distal ends in close-spaced relationship such that said distal tips form an interface engagement plane; and a compliant interconnect disposed between said harness assembly and said device-interface-board, said compliant interconnect including a plurality of conductors and formed to engage said cable distal ends in compressive engagement.

2. A tester interface assembly according to claim 1 wherein:

said device-interface-board comprises a loadboard.

3. A tester interface assembly according to claim 1 wherein:

said device-interface-board comprises a probecard.

\* \* \* \* \*